United States Patent [19]

Yamanaka et al.

[11] Patent Number: 5,250,961
[45] Date of Patent: Oct. 5, 1993

[54] IMAGE FORMING APPARATUS WITH IMPROVED LASER TRANSMITTING OPTICAL SYSTEM

[75] Inventors: Toshihisa Yamanaka, Machida; Tatsuya Eguchi, Toyohashi, both of Japan

[73] Assignee: Minolta Camera Kabushiki Kaisha, Osaka, Japan

[21] Appl. No.: 895,923

[22] Filed: Jun. 9, 1992

[30] Foreign Application Priority Data

Jun. 14, 1991 [JP] Japan ................. 3-143226

[51] Int. Cl.$^5$ ........................................... G03G 15/04
[52] U.S. Cl. ....................................... 346/108; 346/1.1
[58] Field of Search ................. 346/108, 76 L, 168, 346/1.1; 372/29, 31, 33, 49

[56] References Cited

U.S. PATENT DOCUMENTS

| | | | |
|---|---|---|---|
| 4,679,057 | 7/1987 | Hamada et al. | 346/76 L |
| 4,839,901 | 6/1989 | Mozer et al. | 372/49 |
| 4,841,314 | 6/1989 | Ohmori | 346/160 |

FOREIGN PATENT DOCUMENTS 56-114962 9/1981 Japan.

OTHER PUBLICATIONS

Superlattices & Microstructures, vol. 5, No. 2, 1989–AlGaAs/GaAs Superlattice Multi-Quantum-Well Laser Diode, by H. Imamoto et al. pp. 167–170.
IEEE Photonics Technology Letters vol. 1, No. 1, 1989–High Efficiency AlGaAs/GaAs Single-Quantum-Well Semiconductor Laser with Strained Superlattice Buffer Layer by K. Imanaka et al. pp. 8–10.
Applied Physics Letters vol. 54, No. 15, 1989–GaAs Double Quantum Well Laser Diode with Short-Period (AlGaAs)m(GaAs)n Superlattice Barriers by H. Imamoto et al. pp. 1388–1390.
Proceedings of SPIE–The International Society for Optical Engineering vol. 945–Advanced Processing of Semiconductor Devices II by Fumihiko Sato et al. Mar. 17–18 1988 pp. 18–21.
Journal of Crystal Growth 95 (1989) 206–209 North Holland, Amsterdam–High-Quality AlGaAs/GaAs Quantum Well with a Short Period (InGaAs) (GaAs) Strained Superlattice Buffer Layer by F. Sato et al.
Electronics Letters, Jan. 19, 1989 vol. 25, No. 2 pp. 121–122 Visible Multi-Quantum-Well Laser Diode Composed of (AlGaAs)m(GaAs)n Short Period Superlattice by H. Imamoto et al.

Primary Examiner—Joan H. Pendegrass
Attorney, Agent, or Firm—Price, Gess & Ubell

[57] ABSTRACT

An image forming apparatus having a quantum-well semiconductor laser as a light source, a photosensitive member and an optical system for transmitting a laser beam emitted from said quantum-well semiconductor laser to the photosensitive member. The optical system has a reduced transmittance to suppress variations in the laser beam intensity within an allowable range. The transmittance of the optical system is adjusted by providing a reflecting coating on the beam emitting surface of the quantum-well semiconductor laser.

16 Claims, 6 Drawing Sheets

IMAGE FORMING APPARATUS WITH IMPROVED LASER TRANSMITTING OPTICAL SYSTEM

BACKGROUND OF THE INVENTION.

1. Field of the Invention

The present invention relates to image forming apparatus, and more particularly to an image forming apparatus using a semiconductor laser.

2. Description of the Related Art

Conventionally, digital copying machines, laser beam printers and like image forming apparatus have a semiconductor laser as a light source. FIG. 1 shows the relationship between the drive current I of the semiconductor laser for use in such apparatus and the radiation output P thereof. As the ambient temperature T varies to $T_1$, to $T_2$ and to $T_3$ ($T_1<T_2<T_3$), the threshold current $I_{th}$ at which the laser starts oscillation increases with the rise of the ambient temperature T. The temperature dependence of the threshold current $I_{th}$ is represented generally by the following expression (a) wherein $T_0$ is the characteristic temperature intrinsic to the semiconductor laser.

$$I_{th}\,' exp\, T/T_0 \tag{a}$$

Accordingly, the lower the characteristic temperature $T_0$ of the laser, the greater is the temperature dependance. Further when the drive current to be supplied to the laser has a constant value $I_0$, changes in the ambient temperature T result in variations in the radiation output P (variation range: $\Delta P$).

Stripe semiconductor lasers which are used most prevalently are low in characteristic temperature $T_0$ and therefore have great temperature dependence. For this reason, it is likely that the radiation output variation range $\Delta P$ will exceed an allowable range of the image forming process. To preclude this, an auto power control (APC) circuit is provided for controlling the drive current I of the semiconductor laser based on the radiation output P detected.

For the detection of the radiation output, however, the control by the APC circuit requires the emission of light by the laser irrelevant to image formation to shorten the life of the laser. Moreover, the provision of the APC circuit itself leads to an increased cost.

Besides stripe semiconductor lasers, various types of semiconductor lasers are known which include, for example, quantum-well semiconductor lasers having a high characteristic temperature $T_0$ and relatively low in temperature dependence. The quantum-well semiconductor laser nevertheless has a great differential efficiency $\eta$ (inclination of straight line in the laser oscillation region) and therefore has the drawback that the radiation output variation range $\Delta P$ exceeds the allowable range of the image forming process despite the small temperature dependence.

SUMMARY OF THE INVENTION

Accordingly, an object of the present invention is to provide an image forming apparatus having a semiconductor laser incorporated therein with variations in the radiation output thereof suppressed within the allowable range of the image forming process.

Another object of the invention is to provide an image forming apparatus of the type mentioned wherein the transmittance of the optical system thereof for the laser beam from the semiconductor laser to pass through to reach the member to be irradiated is suitably determined to thereby obtain satisfactory images.

Still another object of the invention is to provide an image forming apparatus including a quantum-well semiconductor laser.

BRIEF DESCRIPTION OF THE DRAWINGS

These and other objects or features of the present invention will become apparent from the following description of a preferred embodiment thereof taken in conjunction with the accompanying drawings, in which.

In the following description, like parts are designated by like reference numbers throughout the several drawings.

DESCRIPTION OF THE PREFERRED EMBODIMENT

An embodiment of the present invention will be described below.

Figure 1:
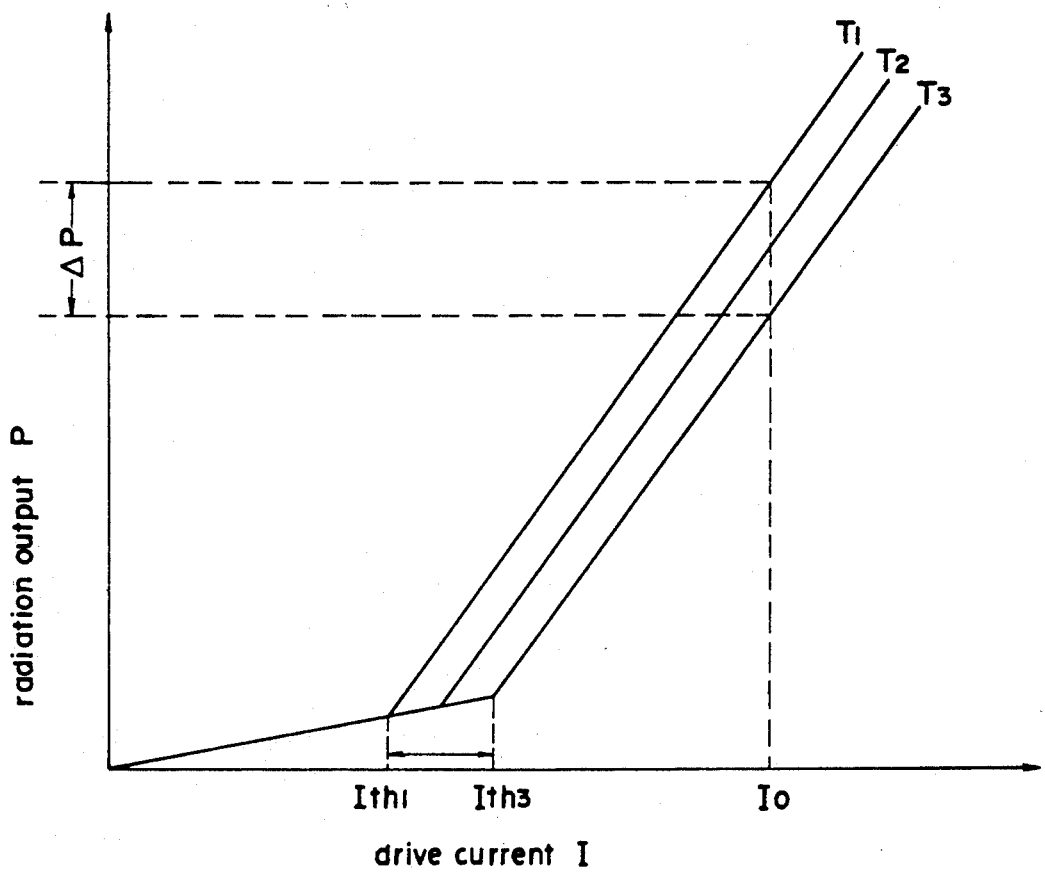
FIG. 1 is a graph showing the relationship between the drive current of a semiconductor laser and the radiation output thereof.
Figure 2:
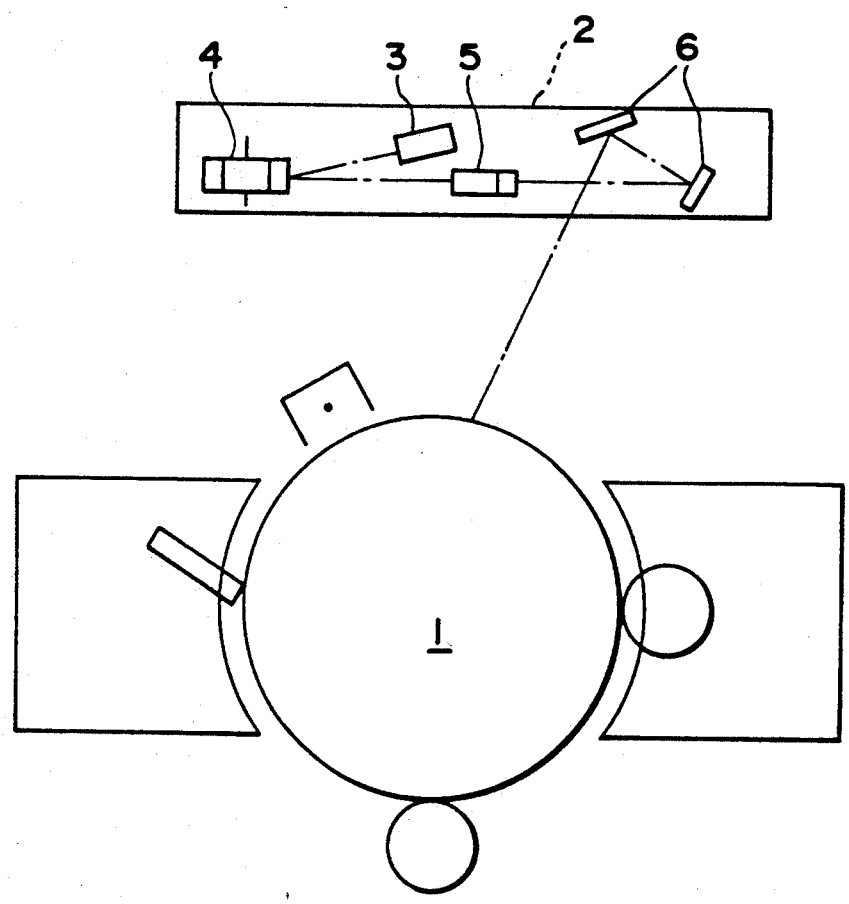
FIG. 2 is a diagram schematically showing the construction of an image forming apparatus embodying the invention.

FIG. 2 schematically shows the construction of the embodiment, i.e., an image forming apparatus embodying the invention. A photosensitive drum 1 is exposed to a laser beam emitted by a printing head 2. The laser beam forms on the drum 1 an electrostatic latent image, which is then developed by a developing unit and transferred onto unillustrated copy paper by a known image forming process.

The printing head 2 has a semiconductor laser 3 serving as a light source, a polygon mirror 4 for deflecting the laser beam from the laser 3, an f$\theta$ lens 5 and reflecting mirrors 6 for directing the laser beam from the f$\theta$ lens 5 toward the photosensitive drum 1.

Given below is specific numerical data relating to the image forming apparatus.

Photosensitive Drum

Organic photosensitive drum having superposed layers

Thickness of photosensitive layer: 19.0 $\mu$m
Dielectric constant: 3.77

Scanning Data

Pixel density: 300 DPI (number of pixels per inch)
Scanning time: 0.6566 $\mu$s/pixel

Shape of Beam

Width in primary scanning direction: 60 $\mu$m
Width in secondary scanning direction: 85 $\mu$m Developing Condition Developing bias: 250 V Charging Condition Charge potential: 610 V In the above image forming apparatus, the laser beam for irradiating the photosensitive drum is set to an intensity of 200 µW in order to obtain the preferred 1-dot line width (108 µm). Furthermore, assuming that the variations in the line width allowable for satisfactory images are not greater than ±5 µm, variations in the intensity of the laser beam for irradiating the photosensitive drum need to be within the range of ±10%.

Now, suppose the predetermined intensity of the laser beam for irradiating the subject to be irradiated (photosensitive drum) is $P_P$, and the variations in the laser beam intensity allowable for giving satisfactory images are within the range of ±A%. The variation range $\Delta P_P$ of the predetermined laser beam intensity allowable on the subject is then given by:

$$\Delta P_P = P_P \cdot 2A/100$$
$$= P_P \cdot A/50$$

Next, assuming that the transmittance of the optical system for the laser beam emitted by the semiconductor laser to pass through to reach the subject to be irradiated is X%, the allowable variation range $\Delta P_A$ of the radiation output of the laser is given by:

$$\Delta P_A = \Delta P_P \cdot 100/X$$
$$= P_P \cdot 2A/X$$
$$= 2AP_P/X$$

Further suppose the variation range of radiation output of the semiconductor laser in the ambient temperature range of from $T_1$ to $T_3$ including an ideal ambient temperature $T_2$ (allowable temperature variation range) is $\Delta P$, the variation range of threshold current of the laser corresponding to this allowable temperature range is $\Delta I$, and the differential efficiency of the laser at the temperature $T_2$ is $\eta$. Since the differential efficiency of the laser is considered to be approximately the same at different temperatures, the variation range $\Delta P$ is given by:

$$\Delta P = \Delta I \cdot \eta$$

This variation range $\Delta P$ is acceptable insofar as it is not greater than the variation range $\Delta P_A$ given previously, that is, insofar as the following expression is satisfied.

$$\Delta I \cdot \eta \leq 2A \, P_P/X$$

Satisfactory images can then be obtained even if the radiation output of the semiconductor laser varies owing to temperature variations.

$\Delta I$ and $\eta$ in the above expression are intrinsic values which are dependent on the characteristics of the semiconductor laser, while A and $P_P$ are intrinsic values dependent on the characteristics of the image forming process. In contrast, the transmittance X of the optical system is adjustable relatively easily by inserting a filter or the like into the optical path for the laser beam, or by coating the reflecting surface of the mirror or the like.

Accordingly, the transmittance X is adjusted so as to satisfy the following expression (1):

$$X \leq 2A \, P_P/\Delta I \cdot \eta \qquad (1)$$

Figure 3:
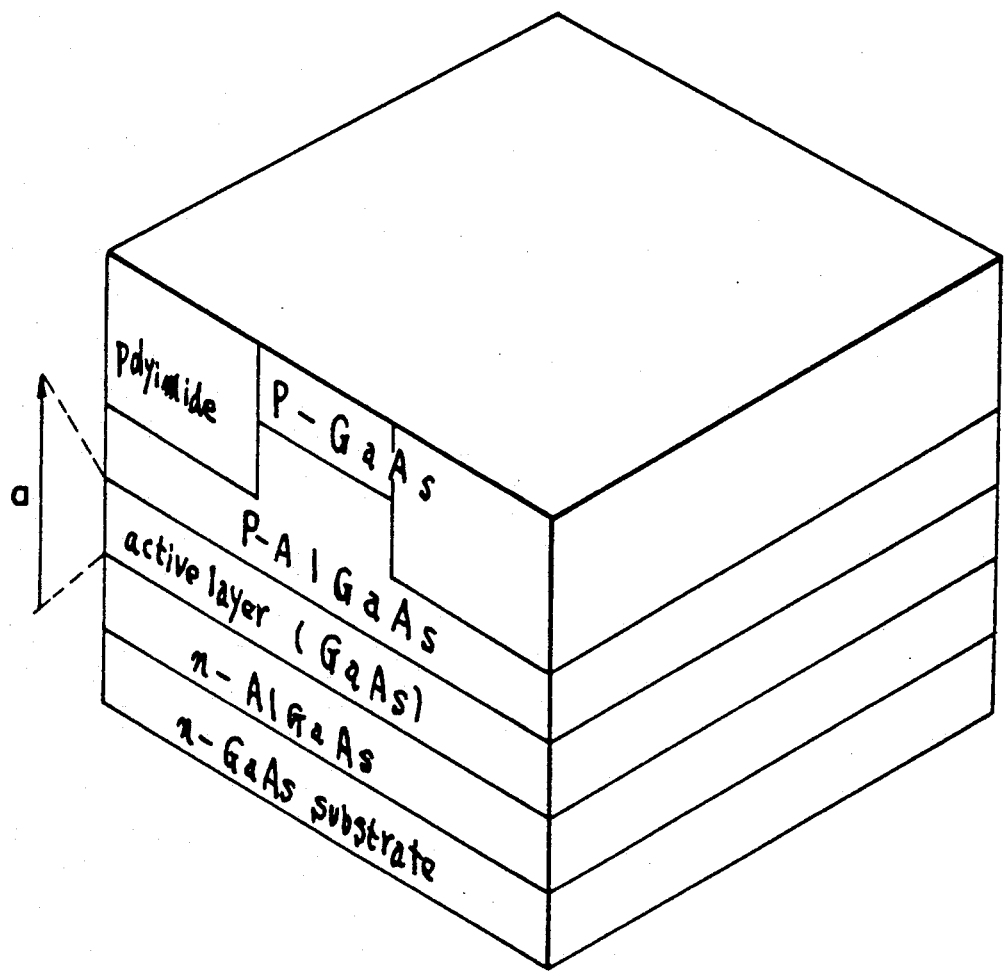
FIG. 3 is a perspective view showing the structure of a double quantum-well semiconductor laser for use in the image forming apparatus of FIG. 2.
Figure 4:
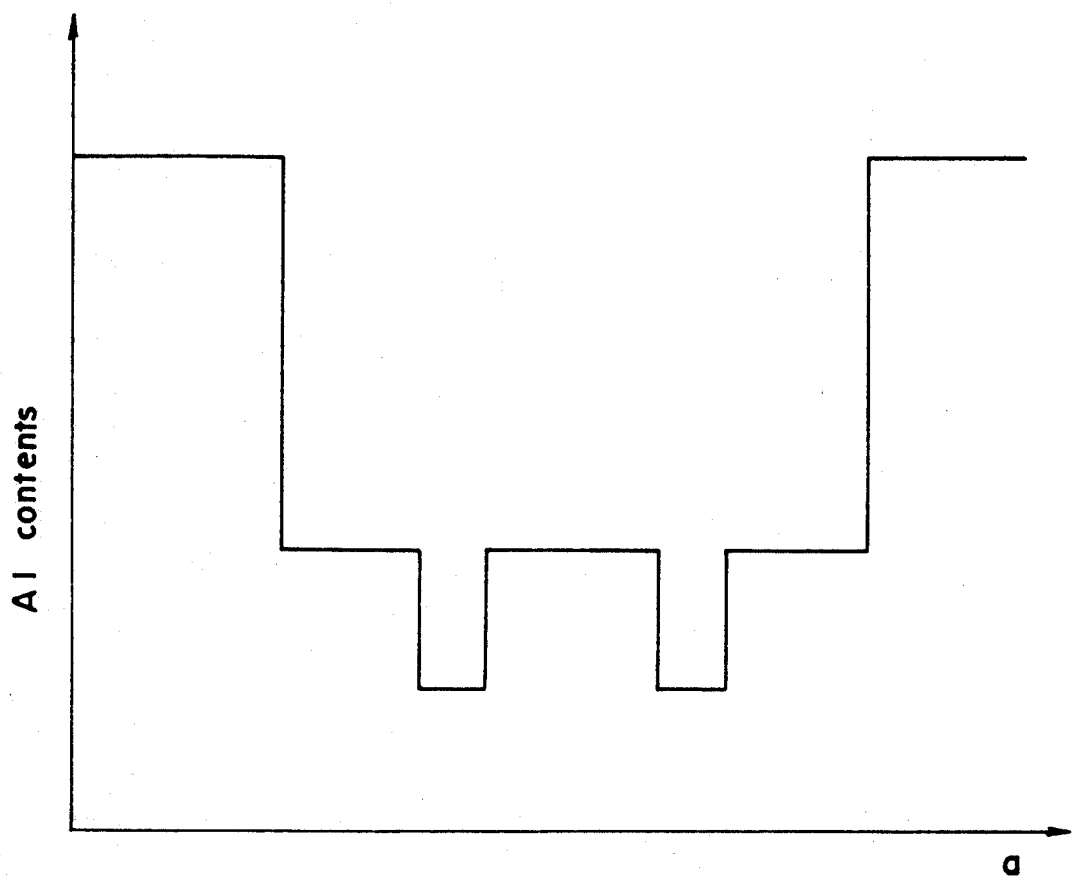
FIG. 4 is a diagram showing the aluminum content distribution of an active layer of the laser shown in FIG. 3.

FIG. 3 shows the structure of a double quantum-well semiconductor laser for use in the present embodiment. This laser has, as arranged from below upward, an n-GaAs substrate, n-AlGaAs layer, active layer (of GaAs), p-AlGaAs layer having a projection, p-GaAs layer provided on the projection and polyimide layer provided on each side of the projection. The arrow a in FIG. 3 corresponds to the abscissa of the graph of FIG. 4. FIG. 4 shows a distribution of Al contents in the active layer and in the vicinity thereof. In this graph, the Al content is plotted as ordinate, and the position in the active layer as abscissa. With respect to the Al content, the active layer has a large low-distribution portion, which further has two small low-distribution portions.

Figure 5:
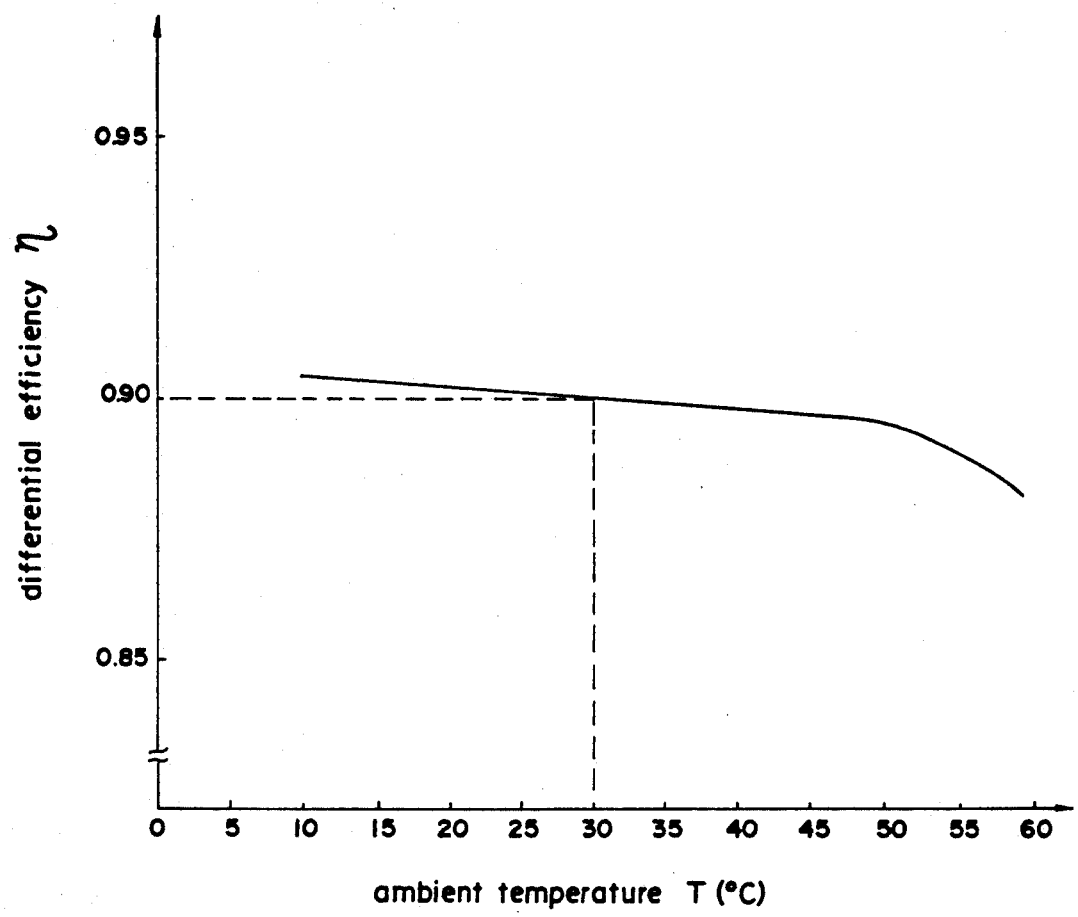
FIG. 5 is a graph showing the relationship between the differential efficiency of the laser shown in FIG. 3 and the ambient temperature.
Figure 6:
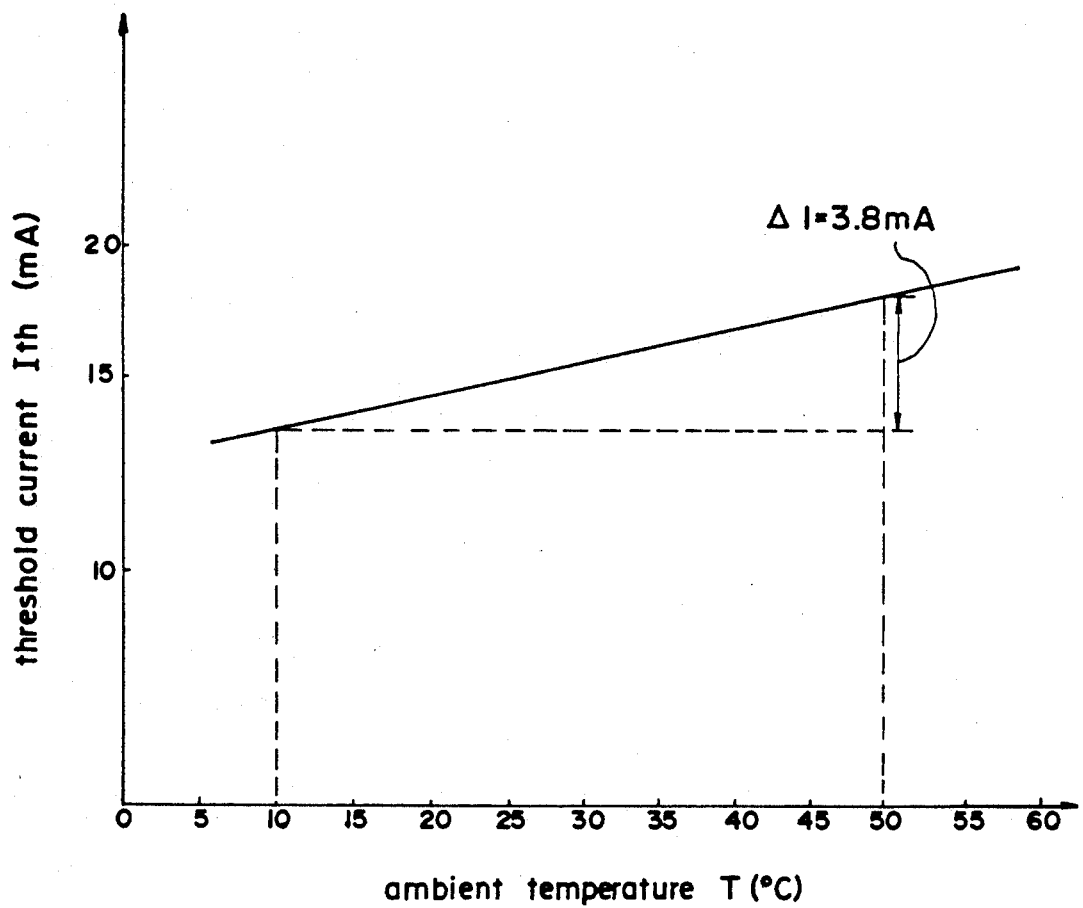
FIG. 6 is a graph showing the relationship between the threshold current of the laser shown in FIG. 3 and the ambient temperature.

FIG. 5 is a graph showing the relationship between the differential efficiency $\eta$ of the double quantum-well semiconductor laser of the present embodiment and the ambient temperature T. FIG. 6 is a graph showing the relationship between the threshold current $I_{th}$ of the laser and the ambient temperature T.

When the range of ambient temperatures at which the semiconductor laser is used is from 10° C. to 50° C., FIG. 5 shows that the differential efficiency $\eta$ at the temperature 30° C. in the middle of this range is 0.9, and FIG. 6 indicates that $\Delta I$ is 3.8 mA. Substitution of these values in the expression (1) reveals that the transmittance X of the optical system is satisfactory if it is not greater than 1.17%. Since optical systems generally in use are about 5% in transmittance, the transmittance X can be reduced to not greater than 1.17%, for example, by providing a filter in the optical path.

To set the optical system to a lower transmittance than in the prior art as stated above, there is a need to increase the radiation output of the laser. It is therefore desired to use a semiconductor laser having a high differential efficiency so as to obtain a beam of increased intensity even if the drive current $I_0$ is small.

With the present embodiment, the transmittance X of the optical system is reduced by forming a reflecting coating with a reflectance of 77% on the beam-emitting surface of the semiconductor laser 3. More specifically, the reflecting coating is formed by coating the surface with $Al_2O_3$ to a thickness of 1200 angstroms as a first layer, and further coating this layer with Si to a thickness of 596 angstroms as a second layer to give a transmittance X of 1.15%.

The optical system thus constructed is adjusted for operation at 30° C. in the middle of the ambient temperature range of 10° C. to 50° C. More specifically, for the semiconductor laser to emit a laser beam with a constant drive current $I_0$, the drive current $I_0$ is so determined that the laser beam will exhibit an intensity of 200 µW upon passing through the optical system thus having the reduced transmittance as stated above and operating at the ambient temperature of 30° C.

With the image forming apparatus having the foregoing construction, the variations in the intensity of laser beam due to temperature variations are confined to the allowable range of the image forming process without using the APC circuit, with the result that satisfactory images are available at all times.

Although specific numerical values are given as conditions for the embodiment, the present invention is not limited by such conditions.

Although the reflecting coating described is formed on the beam-emitting surface of the semiconductor laser, the coating may be provided at any location in the optical path of the optical system. With reference to FIG. 2, the reflecting coating may be provided, for example, on one of the reflecting mirrors 6 for guiding the laser beam to the photosensitive drum 1, or on the fθ lens 5 for concentrating or correcting the laser beam. Also usable as the polygon mirror 4 for deflecting the laser beam is such a mirror which is merely smooth-surfaced with a nontransparent plastics (instead of the reflecting coating).

Although the present invention has been fully described by way of example with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An image forming apparatus comprising:
    a semiconductor laser;
    a photosensitive member;
    an optical system for transmitting a laser beam emitted from said semiconductor laser to said photosensitive member,
    wherein the following expression is satisfied:

$$X \leq 2AP_p/\Delta I \cdot \eta$$

where X is a transmittance of the optical system, A is allowable variation ratio of the ,laser beam intensity on the photosensitive member, $P_P$ is a set value of the laser beam intensity on the photosensitive member, $\Delta I$ is a variation range of threshold current of the semiconductor laser corresponding to an allowable temperature range and $\eta$ is a differential efficiency of the semiconductor laser.

2. An image forming apparatus as claimed in claim 1, wherein said optical system includes reducing means for reducing the transmittance of the optical system.

3. An image forming apparatus as claimed in claim 2, wherein said reducing means includes a reflecting coating.

4. An image forming apparatus as claimed in claim 2, wherein said reducing means is provided on the beam emitting surface of the semiconductor laser.

5. An image forming apparatus as claimed in claim 2, wherein said reducing means is provided on a mirror for reflecting the laser beam.

6. An image forming apparatus as claimed in claim 2, wherein said reducing means is provided on a lens through which the laser beam passes.

7. An image forming apparatus comprising
    a quantum-well semiconductor laser;
    a photosensitive member;
    an optical system for transmitting a laser beam emitted from said quantum-well semiconductor laser to said photosensitive member,
    wherein the following expression is satisfied:

$$X \leq 2AP_p/\Delta I \eta$$

where X is a trasnmittance of the optical system. A is an allowable variation ratio of the laser beam intensity on the phtosensitive member, $P_p$ is a set value of the laser beam intensity on the photosensitive member, $\Delta I$ is a variation range of threshold current of the quantum-well semiconductor laser corresponding to an allowable temperature range and $\eta$ is a differential efficiency of the quantum-well semiconductor laser.

8. An image forming apparatus as claimed in claim 7, wherein said optical system includes reducing means for reducing the transmittance of the optical system.

9. An image forming apparatus as claimed in claim 8, wherein said reducing means includes a reflecting coating.

10. An image forming apparatus as claimed in claim 8, wherein said reducing means is provided on the beam emitting surface of the quantum-well semiconductor laser.

11. An image forming apparatus as claimed in claim 8, wherein said reducing means is provided on a mirror for reflecting the laser beam.

12. An image forming apparatus as claimed in claim 8, wherein said reducing means is provided on a lens through which the laser beam passes.

13. A method of manufacturing a laser optical unit, comprising the step of:
    providing a quantum-sell semiconductor laser as a light source;
    setting a transmittance X on an optical path of a laser beam emitted from the quantum-well semiconductor laser,
    wherein the following expression is satisfied:

$$X \leq 2AP_p/\Delta I \eta$$

Where A is an allowable variation ratio of the laser beam intensity on a beam receiving surface, $P_P$ is a set value of the laser beam intensity on the beam recieving surface, $\Delta I$ is a variation range of threshold current of the quantum-well semiconductor laser corresponding to an allowable temperature range and $\eta$ is a differential efficiency of the quantum-well semiconductory laser.

14. An improved optical system for providing a predetermined range of laser intensity to a work surface, such as a photosensitive member of an image forming apparatus, comprising:
    a semiconductor laser;
    an optical system for transmitting a laser beam emitted from said semiconductor laser to a work surface,
    wherein the following expression is satisfied:

$$X \leq 2AP_P/\Delta I \cdot \eta$$

where X is a transmittance of the optical system, A is an allowable variation ratio of the laser beam intensity on the work surface, $P_P$ is a set value of the laser beam intensity on the work surface, $\Delta I$ is a variation range of threshold current of the semiconductor laser corresponding to an allowable temperature range and $\eta$ is a differential efficiency of the semiconductor laser.

15. An image forming Apparatus as claimed in claim 14, wherein said optical system includes reducing means for reducing the transmittance of the optical system.

16. An image forming apparatus as claimed in claim 15, wherein said reducing means includes a reflecting coating.

* * * * *